(12) United States Patent
Abraham

(10) Patent No.: US 7,239,857 B2
(45) Date of Patent: *Jul. 3, 2007

(54) METHOD AND APPARATUS FOR COMPENSATING AN OSCILLATOR IN A LOCATION-ENABLED WIRELESS DEVICE

(75) Inventor: Charles Abraham, San Jose, CA (US)

(73) Assignee: Global Locate, Inc, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/311,088

(22) Filed: Dec. 19, 2005

(65) Prior Publication Data

US 2006/0094465 A1     May 4, 2006

Related U.S. Application Data

(63) Continuation of application No. 10/372,015, filed on Feb. 20, 2003, now Pat. No. 7,010,307.

(60) Provisional application No. 60/359,170, filed on Feb. 22, 2002.

(51) Int. Cl.
*H04B 1/06* (2006.01)
*H04B 7/00* (2006.01)

(52) U.S. Cl. ............ 455/255; 455/264; 455/265; 455/456.1; 455/456.2; 455/456.5; 455/456.6; 455/553.1; 342/357.1; 331/158; 331/176

(58) Field of Classification Search ............ 455/255, 455/264, 265, 456.1–457, 553.1; 342/357.1, 342/357.6, 357.12; 331/158, 176
See application file for complete search history.

(56) References Cited

U.S. PATENT DOCUMENTS

| | | | |
|---|---|---|---|
| 2,387,512 A | 10/1945 | Hilberg | |
| 4,380,745 A | 4/1983 | Barlow et al. | |
| 4,401,050 A | 8/1983 | Britt et al. | |
| 4,611,181 A | 9/1986 | Fukumura et al. | |
| 4,921,467 A | * 5/1990 | Lax | 455/264 |
| 5,081,431 A | 1/1992 | Kubo et al. | |
| 5,172,075 A | 12/1992 | Yerbury et al. | |
| 5,415,911 A | 5/1995 | Zampa et al. | |
| 5,629,708 A | 5/1997 | Rodal et al. | |
| 5,634,205 A | 5/1997 | Kurisu et al. | |
| 5,654,718 A | 8/1997 | Beason et al. | |
| 5,663,735 A | 9/1997 | Eshenbach | |
| 5,724,909 A | 3/1998 | Pitman et al. | |

(Continued)

OTHER PUBLICATIONS

International Search Report mailed Jul. 11, 2005 for PCT Application No. PCT/US03/05287.

*Primary Examiner*—Steve M. D'Agosta
(74) *Attorney, Agent, or Firm*—Moser IP Law Group

(57) ABSTRACT

A method and apparatus for compensating an oscillator in a location-enabled wireless device is described. In an example, a mobile device includes a wireless receiver for receiving wireless signals and a GPS receiver for receiving GPS signals. The mobile device also includes an oscillator having an associated temperature model. A frequency error is derived from a wireless signal. The temperature model is adjusted in response to the frequency error and a temperature proximate the oscillator. Frequency error of the oscillator is compensated using the adjusted temperature model. In another example, a frequency error is derived using a second oscillator within the wireless receiver.

17 Claims, 13 Drawing Sheets

U.S. PATENT DOCUMENTS

| | | |
|---|---|---|
| 5,740,525 A | 4/1998 | Spears |
| 5,841,396 A | 11/1998 | Krasner |
| 5,904,017 A | 5/1999 | Glatz et al. |
| 5,933,059 A | 8/1999 | Asokan |
| 5,940,027 A | 8/1999 | Forseth et al. |
| 6,041,222 A * | 3/2000 | Horton et al. ............ 455/255 |
| 6,237,266 B1 | 5/2001 | Tassey et al. |
| 6,253,478 B1 | 7/2001 | Kalavity |
| 6,487,802 B2 | 12/2002 | Suen |
| 6,508,900 B1 | 1/2003 | Kendall et al. |
| 6,630,872 B1 | 10/2003 | Lanoue et al. |

\* cited by examiner

METHOD AND APPARATUS FOR COMPENSATING AN OSCILLATOR IN A LOCATION-ENABLED WIRELESS DEVICE

CROSS-REFERENCE TO RELATED APPLICATIONS

This application is a continuation of U.S. patent application Ser. No. 10/372,015, filed on Feb. 20, 2003 now U.S. Pat. No. 7,010,307, which claims the benefit of U.S. provisional patent application Ser. No. 60/359,170, filed Feb. 22, 2002, both of which are incorporated herein by reference.

BACKGROUND OF THE INVENTION

1. Field of the Invention

The present invention generally relates to global position system (GPS) devices and, more particularly, to compensating an oscillator used to receive satellite signals within a location-enabled wireless device.

2. Description of the Related Art

The process of measuring a global positioning system (GPS) signal begins with a procedure to search for the GPS signal in the presence of noise by attempting a series of correlations of the incoming signal against a known pseudo-random noise (PRN) code. The search process can be lengthy, as both the exact frequency of the signal and the time-of-arrival delay are unknown. To find the signal, receivers traditionally conduct a two dimensional search, checking each delay possibility at every possible frequency. To test for the presence of a signal at a particular frequency and delay, the receiver is tuned to the frequency, and the incoming signal is correlated with the known PRN code delayed by an amount corresponding to the time of arrival. If no signal is detected, the search continues to the next delay possibility, and after all delay possibilities are checked, continues to the next frequency possibility. Each individual correlation is performed over one or more milliseconds in order to allow sufficient signal averaging to distinguish the signal from the noise. Such averaging is known as "integration". Because many thousand frequency and delay possibilities are checked, the overall acquisition process can require tens of seconds.

Recently, new applications of GPS technology in wireless devices have emerged, for example, imbedding GPS receivers in cellular phones to provide emergency location capability. In these applications, rapid signal acquisition in just a few seconds is required. Furthermore, these applications require a GPS receiver to operate in harsh signal environments and indoors, where GPS signal levels are greatly attenuated. Detecting attenuated signals requires each correlation to be performed over a relatively long period of time. For example, integration may be performed over a few seconds, as opposed to the 1–10 millisecond period used in traditional GPS receivers. The two-dimensional sequential search process employed by traditional receivers becomes impractical at such long integration times, because the overall search time increases by a factor of 100 or more.

The performance of a GPS receiver is greatly affected by the frequency stability of the oscillator used to receive the satellite signals. A high stability oscillator source may dramatically decrease the amount of time required to fix location by eliminating the need to search across a wide range of frequency bins. Furthermore, a high stability oscillator source enables the use of long integration intervals in the GPS receiver, greatly enhancing the ability to detect attenuated satellite signals.

In some cases, GPS receivers utilize a temperature compensated crystal oscillator (TCXO) to provide a stable frequency source. TCXOs employ a-priori temperature models or characteristics to adjust output frequency as a function of temperature. Cost effective TCXOs are available that provide stability on the order of two parts per million. While this is adequate for conventional GPS receivers, such stability is not adequate for GPS receivers designed to operate very quickly, with long integration intervals.

U.S. Pat. No. 5,629,708 describes a method of performing temperature compensation of an oscillator using a temperature sensor. The method uses frequency error measurements from GPS signals to adjust a temperature model for a TCXO over time. Adjusting the temperature model over time improves oscillator accuracy when compared to continuous use of an a-priori temperature model. The adjustment process requires the GPS receiver to be operated on a regular basis to keep the temperature model accurate. Such a technique, however, is unsuitable for cellular telephone phone emergency location using GPS, where the GPS receiver may be unused for extended periods. Furthermore, the technique requires that the GPS receiver have the capability of performing Doppler measurements, which typically requires a tracking loop receiver, as opposed to a matched filter receiver often preferred in cellular telephone applications.

Therefore, there exists a need in the art for a method and apparatus that compensates an oscillator in a GPS-capable wireless device without employing frequency error measurements obtained from satellite signals.

SUMMARY OF THE INVENTION

A method and apparatus for compensating an oscillator in a location-enabled wireless device is described. In one embodiment of the invention, a mobile device includes a wireless receiver for receiving wireless signals and a GPS receiver for receiving GPS signals. The mobile device also includes an oscillator having an associated temperature model. A frequency error is derived from a wireless signal. A temperature proximate the oscillator is sensed. The temperature model is adjusted in response to the frequency error and the temperature. Frequency error of the oscillator is compensated using the adjusted temperature model.

In another embodiment, a mobile device includes a wireless receiver for receiving wireless signals and a GPS receiver for receiving GPS signals. The mobile device includes a first oscillator having an associated temperature model. The wireless receiver includes a second oscillator. Frequency error of the second oscillator is compensated to produce a frequency reference signal. A temperature proximate the first oscillator is sensed. The temperature model is adjusted responsive to the frequency reference signal and the temperature. Frequency error of the first oscillator is compensated using the adjusted temperature model.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

A method and apparatus for compensating an oscillator within a location-enabled wireless device is described. One or more aspects of the invention relate to adjusting a temperature model associated with an oscillator within a cellular telephone using a cellular signal. Those skilled in the art, however, will appreciate that the invention may be used within other types of mobile or wireless devices that are location-enabled, such as pagers, laptop computers, personal digital assistants (PDAs), and like type wireless devices known in the art. In addition, the location of the wireless device is facilitated by processing global positioning system (GPS) satellite signals. Although GPS is described as an embodiment, other satellite based systems could be used, such as GLONASS, GALIEO, and the like.

Figure 1:
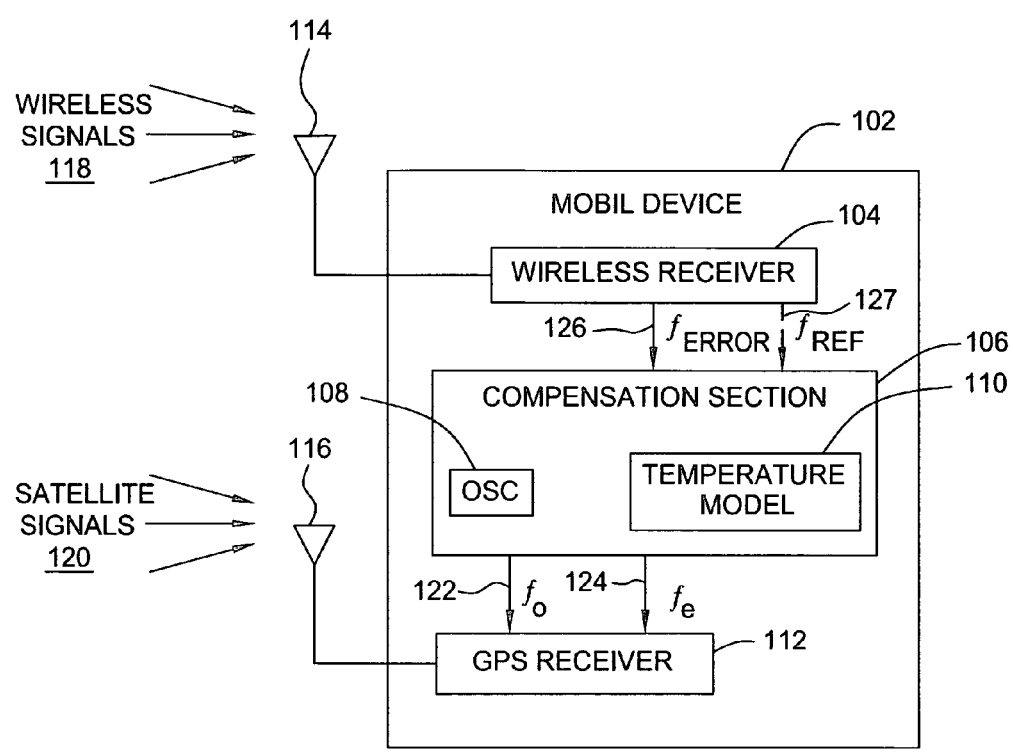
FIG. 1 depicts a high-level block diagram showing a mobile device in accordance with one or more aspects of the invention.

FIG. 1 depicts a high-level block diagram of a mobile device 102 in accordance with one or more aspects of the invention. The mobile device 102 includes a wireless receiver 104 coupled to an antenna 114, an oscillator compensation section ("compensation section" 106), and a GPS receiver 112 coupled to an antenna 116. The compensation section 106 includes an oscillator 108 and a temperature model or characteristic associated with the oscillator 108 ("temperature model" 110). The wireless receiver 104 receives wireless signals 118 using the antenna 114. For example, the wireless receiver 104 may include a cellular telephone receiver that receives cellular signals from a cell tower (not shown). The GPS receiver 112 receives satellite signals 120 from orbiting satellites (not shown) using antenna 116.

The GPS receiver 112 processes the satellite signals 120 using oscillator 108. Notably, the oscillator 108 produces a signal having a particular frequency, $f_o$ ("oscillator signal" 122). The GPS receiver 112 mixes the oscillator signal 122 and the satellite signals 120 to produce baseband or near baseband signals, which can be used to compute the location of the mobile device 102. The operation of GPS receiver 112 is well-known in the art. The GPS receiver 112 may be a conventional receiver, as described in U.S. Pat. No. 4,968,891 (issued Nov. 6, 1990), or an assisted GPS receiver, as described in commonly-assigned U.S. Pat. No. 6,453,237 (issued Sep. 17, 2002), each of which are incorporated by reference herein in their entireties. The term "GPS receiver" as used herein is intended to encompass both conventional GPS receivers and assisted GPS receivers.

In one embodiment of the invention, the wireless receiver 104 processes the wireless signals 118 using oscillator 108. Similar to the GPS receiver 112, the wireless receiver 104 mixes the oscillator signal 122 and the wireless signals 118 to produce baseband or near baseband signals. The processed wireless signals 118 include a signal that can be used to derive a frequency error of the oscillator 108, $f_{error}$ ("frequency error information" 126). For example, the frequency error information 126 may be derived from a pilot signal transmitted along with the wireless signals 118, such as a cellular telephone pilot signal or pilot tone burst. Alternatively, the frequency error information 126 may be derived from the carrier frequency of the wireless signals 118 or the modulation within the wireless signals 118. In another embodiment, the wireless receiver 104 includes a separate oscillator for processing the wireless signals 118. In such an embodiment, a frequency reference signal 127 may be derived from the separate oscillator within the wireless receiver 104.

As described in more detail below, the compensation section 106 uses the temperature model 110 to compensate for frequency error in the oscillator signal 122. In one embodiment, the temperature model 110 is a model of expected frequency error in the oscillator signal 122 over a range of temperatures. For example, the oscillator 108 may be a temperature controlled crystal oscillator (TCXO). In another embodiment, the temperature model 110 is a model of estimated steering voltage for the oscillator 108 over a range of temperatures. For example, the oscillator 108 may be a voltage controlled oscillator (VCO).

In one embodiment of the invention, the compensation section 106 generates a signal estimating the frequency error, $f_e$, of the oscillator 108 ("oscillator error signal" 124). The oscillator error signal 124 is coupled to the GPS receiver 112. The GPS receiver 112 may use the oscillator error signal 124 to compensate for frequency error in the oscillator signal 122. In another embodiment, the compensation section 106 compensates for error in the oscillator signal 124 directly and supplies the compensated oscillator signal 122 to the GPS receiver 112 without supplying the error signal 124.

The compensation section 106 generates the oscillator error signal 124 using the temperature model 110. The temperature model 110 is adjusted or updated using the frequency error information 126 ($f_{error}$) supplied by the wireless receiver 104. Adjusting the temperature model 110 using the frequency error information 126 is described in more detail below. In another embodiment, the temperature model 110 is adjusted or updated using the frequency reference signal 127 ($f_{REF}$). Adjusting the temperature model 110 using the frequency reference signal 127 is also described in more detail below. In either embodiment, by adjusting the temperature model 110, the invention accounts for component variations and drifts within the mobile device 102 that may occur over time. As such, the invention provides for significantly better frequency stability of the oscillator 108 than is achieved using a static temperature model 110.

Figure 2:
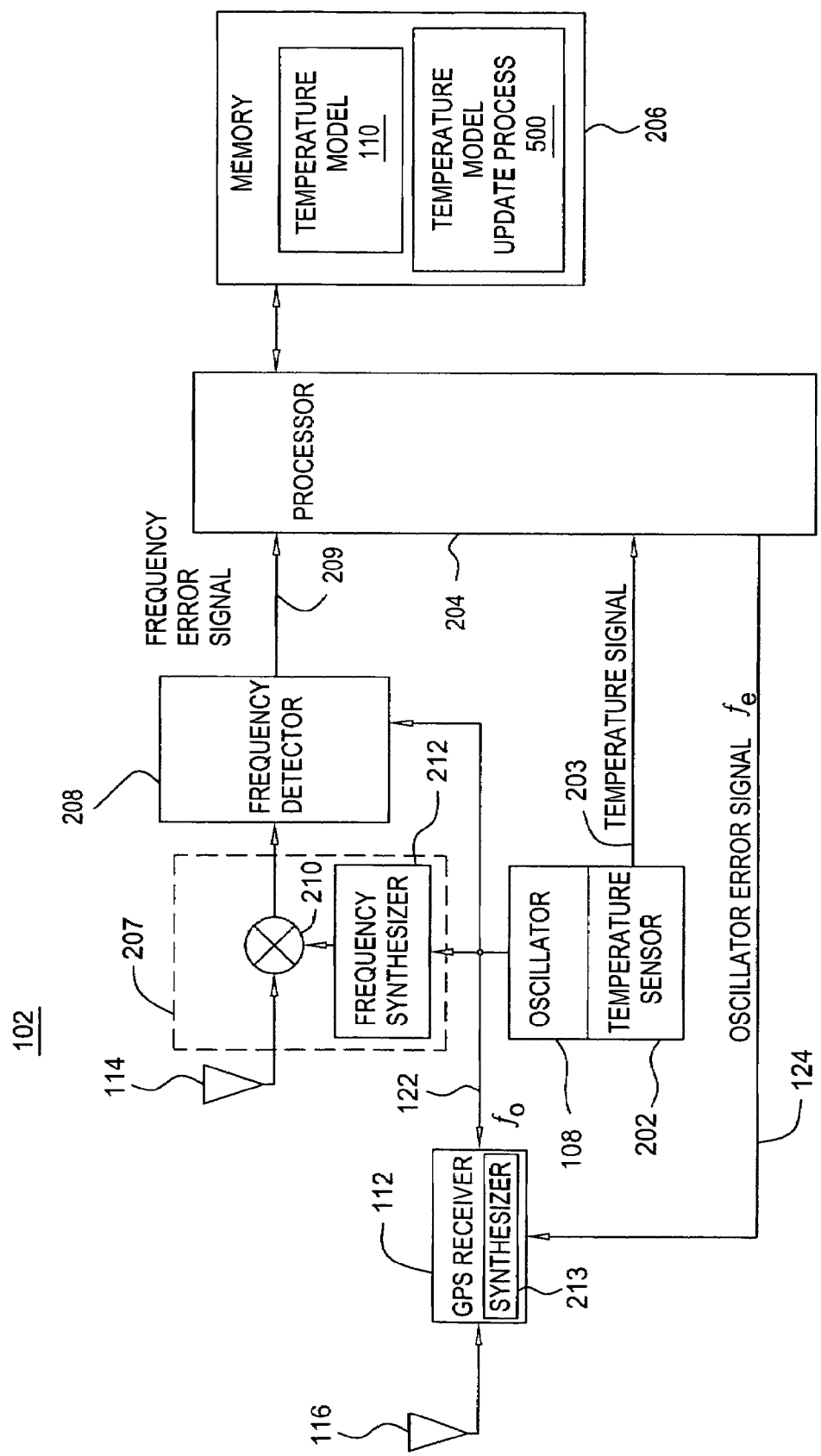
FIG. 2 depicts a block diagram showing an exemplary embodiment of a portion of the mobile device of FIG. 1 in accordance with one or more aspects of the invention.

FIG. 2 depicts a block diagram showing an exemplary embodiment of a portion of the mobile device 102 in accordance with one or more aspects of the invention. Elements of FIG. 2 that are the same or similar to those depicted in FIG. 1 are designated with identical reference numerals. The mobile device 102 includes a tuner 207, a frequency or phase detection circuit ("frequency detector" 208), a temperature sensor 202, a processor 204, a memory 206, the GPS receiver 112, and the oscillator 108. The oscillator 108 provides the oscillator signal 122 to both the tuner 207 and the GPS receiver 112. The GPS receiver 112 and the tuner 207 utilize the oscillator signal 122 to receive GPS and wireless signals, respectively. Notably, the GPS receiver 112 includes a frequency synthesizer 213 that uses the oscillator signal 122 as a reference for receiving and processing GPS signals.

The temperature sensor 202 operates in close proximity to the oscillator 108 (e.g., is attached to the oscillator housing or crystal casing). The temperature sensor 202 senses the temperature of the oscillator 108 and provides a signal indicative of the measured temperature to the processor 204 ("temperature signal" 203). For example, the oscillator 108 may be a temperature controlled crystal oscillator (TCXO). The temperature signal 203 may include many temperature measurements made over time. The processor 204 uses the temperature signal 203 to generate the oscillator error signal 124. As described above, the oscillator error signal 124 is an estimate of frequency error of the oscillator 108 and is generated using the temperature model 110 in a known manner. The oscillator error signal 124 may be expressed as an offset in the frequency of the oscillator 108 from its nominal design frequency, for example in units of parts-per-million (ppm). The oscillator error signal 124 is coupled to the GPS receiver 112, which accepts the estimate of oscillator error as a software correction. As will be understood by those skilled in the art of GPS receiver design, the software correction may be used to reduce the frequency tuning error introduced by the oscillator 108. In this manner, the frequency search range of the GPS receiver 112 may be greatly reduced. One example of a GPS receiver that performs frequency error correction using a software correction technique is disclosed in commonly-assigned U.S. patent application Ser. No. 10/345,604, filed Jan. 16, 2003, which is incorporated herein by reference in its entirety.

The processor 204 is coupled to the memory 206. The memory 206 may include one or more of random access memory, read only memory, magneto-resistive read/write memory, optical read/write memory, cache memory, magnetic read/write memory, and the like, as well as signal-bearing media. The memory 206 may store all or portions of one or more programs or data to implement the processes and methods of the invention. Notably, the memory 206 stores the temperature model 110 and a temperature model update process 500. Although the invention is disclosed as being implemented as a processor executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

The tuner 207 includes a mixer 210 and a frequency synthesizer 212. The mixer 210 is coupled to the antenna 114 and the frequency synthesizer 212. The frequency synthesizer 212 is also coupled to the oscillator 108 and receives the oscillator signal 122. The frequency synthesizer 212 uses the oscillator signal 122 as a reference to produce a mixing signal for downconverting wireless signals. The tuner 207 uses the mixer 210 and the frequency synthesizer 212 to receive wireless signals in a known manner.

The output of the tuner 207 is coupled to the frequency detector 208. The frequency detector 208 detects a frequency reference within the output of the tuner 207 and compares the frequency reference with output of the oscillator 108 to produce the frequency error information 209. In one embodiment of the invention, the frequency reference is a pilot signal and the frequency detector 208 is a pilot tone frequency detector. For example, in General Mobile System (GSM) wireless networks, the pilot signal consists of a frequency correction burst that is broadcast periodically by the network. The burst is intended to allow cellular receivers to maintain frequency alignment with base stations. The frequency detector 208 may be used to measure the frequency of the pilot signal. Any error in the oscillator signal 122 will result in an offset of the pilot frequency signal from its nominal value. The frequency detector 208 measures this offset and produces a frequency error signal 209, which is supplied to the processor 204. The frequency error signal 209 includes a plurality of frequency error measurements over time. As described in more detail below, the processor 204 executes the temperature model update process 500 and uses the frequency error signal 209 to adjust the temperature model 110. In other types of wireless receivers, the frequency detector 208 includes a frequency control circuit for frequency or phase locking to the wireless signal. For example, the frequency detector 208 may be an automatic frequency control (AFC) circuit that locks to the phase or frequency of a carrier or modulation of the wireless signal.

Figure 3:
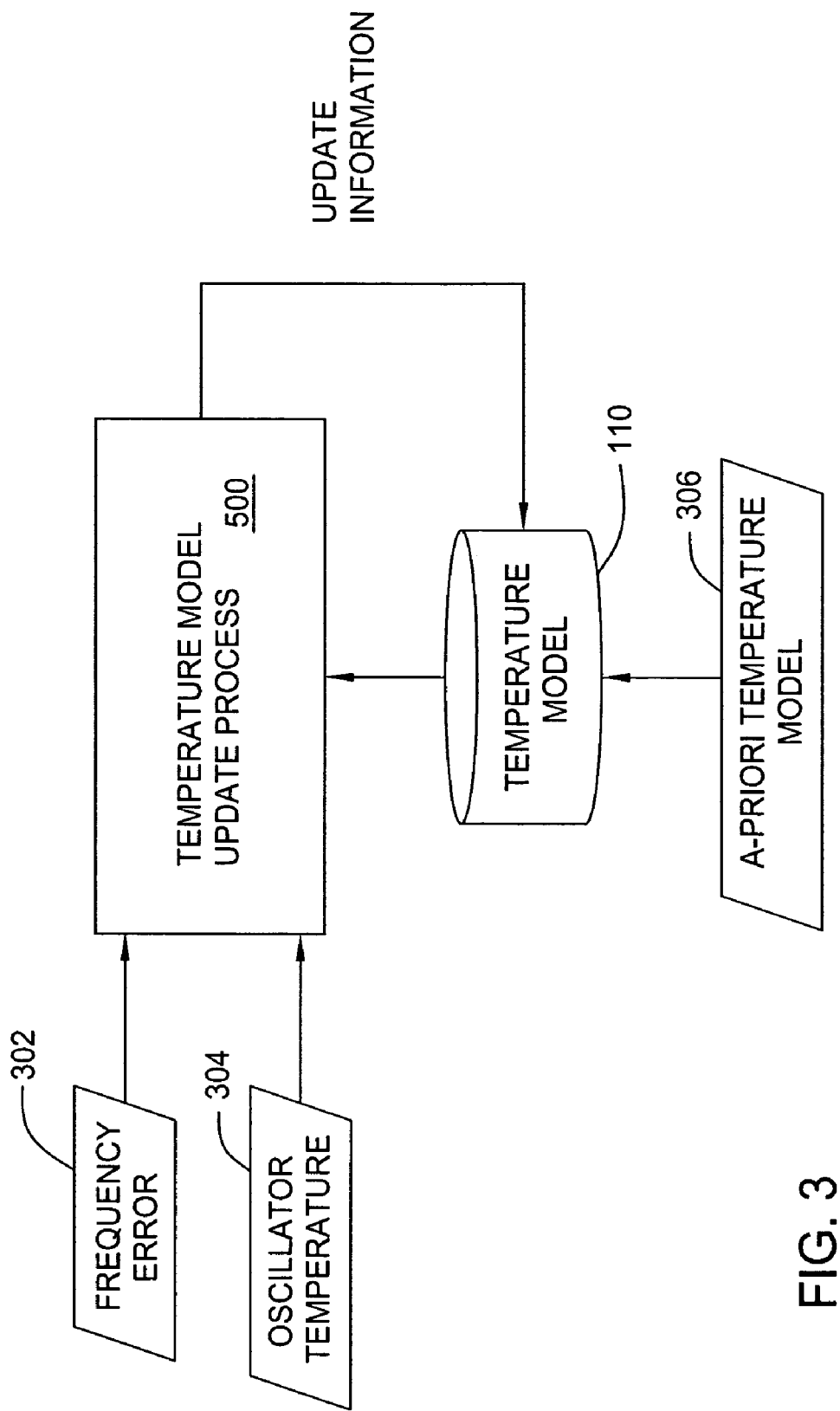
FIG. 3 depicts a data flow diagram showing the operation of the embodiment of the mobile device depicted in FIG. 2.

FIG. 3 depicts a data flow diagram showing the operation of the embodiment of the mobile device 102 depicted in FIG. 2. A frequency error 302, an oscillator temperature 304, and the temperature model 110 are input to a temperature model update process 500. The temperature model update process 500 is described in more detail below. Initially, the temperature model 110 is based on an a-priori temperature model 306 associated with the oscillator 108. The a-priori temperature model 306 may be programmed into the memory 206 at the factory, and will usually be generic data applicable to a class of oscillator used in the design. In one embodiment of the invention, the a-priori temperature model 306 includes of a series of predicted oscillator offsets at a set of temperatures spaced over an operating temperature range of the mobile device 102. In other embodiments, the a-prior temperature model 306 may consist of coefficients of a function, such as a polynomial fit.

Initially, the temperature model 110 is based solely on the a-priori temperature model 306. The oscillator error signal 124 produced using the initial temperature model 110 will be erroneous due to several effects. For one, individual samples of oscillators may vary, while the a-priori temperature model 306 is programmed identically for all devices. Second, oscillator characteristics can drift over time, thus the a-priori temperature model 306 may become inaccurate after many months of use. Finally, errors in the oscillator temperature 304 may introduce perceived modeling errors, that is, even if the temperature model 110 is correct, the prediction will be incorrect if the detected temperature is in error.

As such, the invention updates the temperature model 110. Notably, the frequency error 302 provides information indicative of the actual frequency error of the oscillator 108 at a measured temperature. As described in more detail below, these actual error measurements are used to improve the temperature model 110. Over time, as frequency error measurements are accumulated across operating temperatures, the temperature model 110 will be fully updated. Thus, the invention adapts to errors in individual oscillators, errors induced by drift over time, and errors in temperature sensing.

Figure 4A:
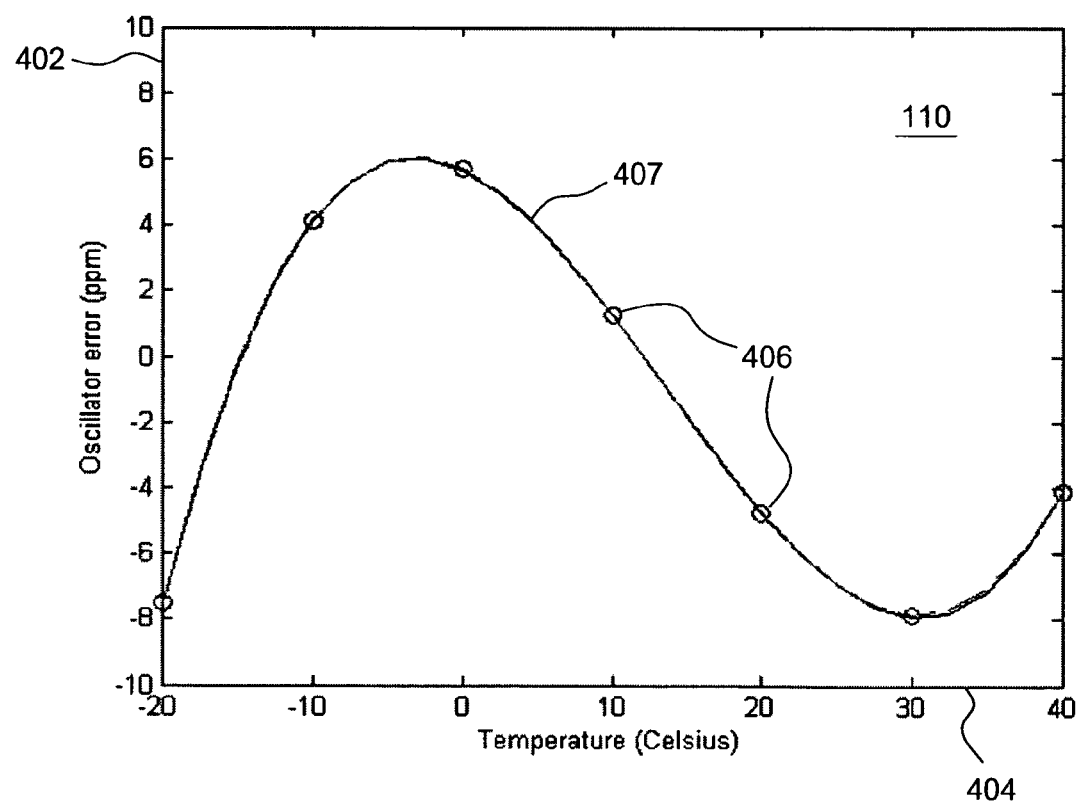
FIGS. 4A–C show graphs of illustrative a-priori and updated oscillator temperature models in accordance with one or more aspects of the invention.

FIG. 4A depicts a graph showing an illustrative temperature model 110 as initially based on an a-priori temperature model 306 in accordance with one or more aspects of the invention. An axis 402 represents oscillator error in units of ppm, and an axis 404 represents temperature in degrees Celsius. The temperature model 110 includes a plurality of predicted oscillator offsets 406 (seven are shown). Since the temperature model 110 is based on the a-priori temperature model 306, the predicted oscillator offsets 406 indicate pre-programmed predictions of the oscillator error in parts-per-million for a particular temperature in degrees Celsius. While only seven of the predicted oscillator offsets 406 are shown for purposes of exposition, in practice, the temperature model 110 may include a multiplicity of predicted offsets 406. As is apparent from FIG. 4A, the temperature model 110 of the oscillator 108 may be modeled as a continuous curve 407. Notably, if the oscillator 108 is a TCXO, the temperature model 110 is related to the physics of the crystal. The temperature model 110 may be modeled using a polynomial fit to the predicted oscillator offsets 406.

Figure 5:
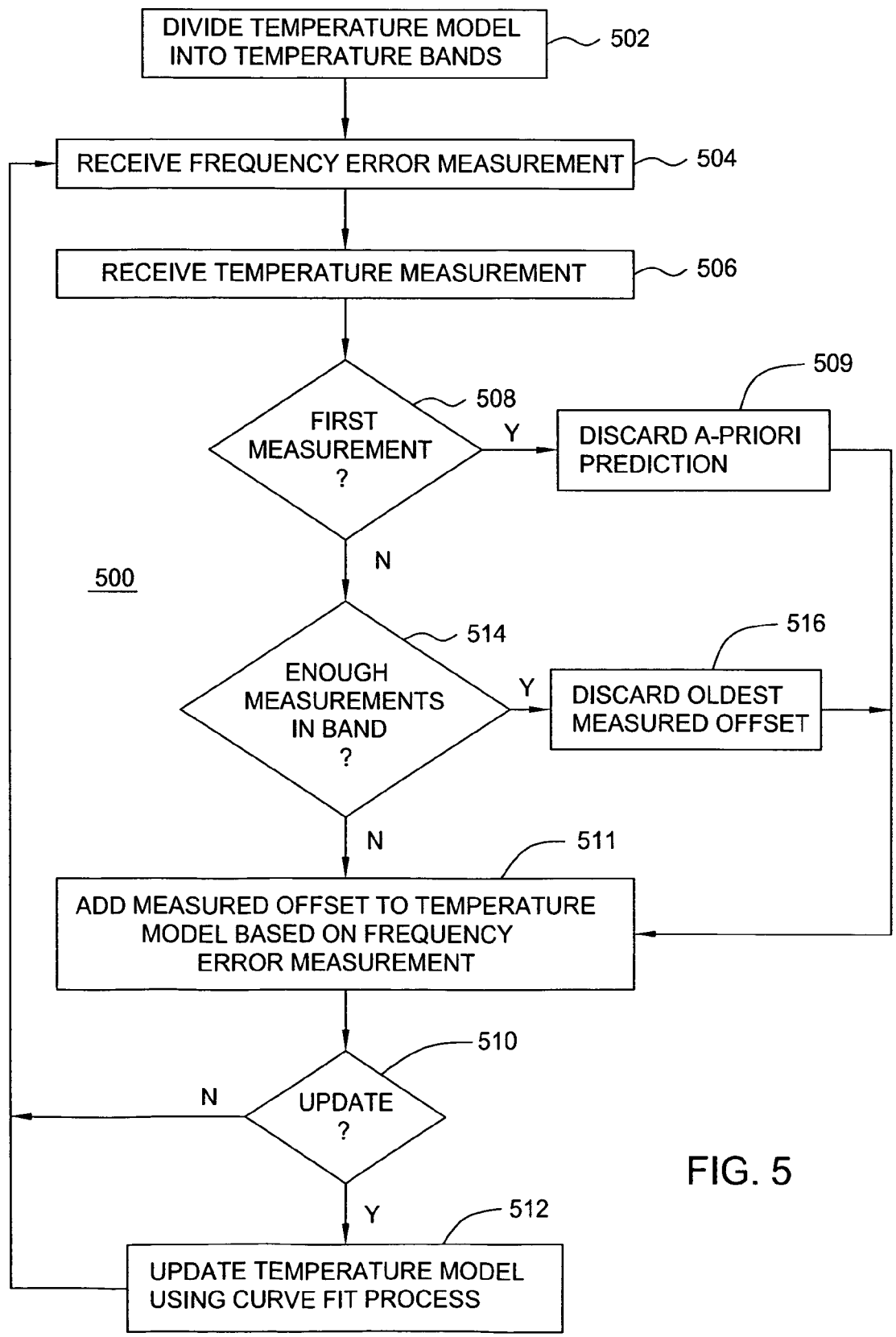
FIG. 5 depicts a flow diagram showing an exemplary embodiment of a temperature model update process in accordance with one or more aspects of the invention.

FIG. 5 depicts a flow diagram showing an exemplary embodiment of the temperature model update process 500 in accordance with one or more aspects of the invention. The process 500 begins at step 502, where the full operating temperature range of a temperature model associated with an oscillator is subdivided into temperature bands. For example, the full operating temperature range can be subdivided into bands spanning five degrees Celsius. At step 504, a new frequency error measurement is received. The frequency error measurement is derived from a frequency reference of a wireless signal. For example, the frequency error measurement may be a frequency offset of a pilot signal from a nominal frequency. In another example, described in more detail below, the frequency error measurement may be a difference between the frequency of the oscillator and the frequency of a second steered oscillator. At step 506, a current temperature measurement is received. The temperature measurement provides information indicative of the temperature of the oscillator.

At step 508, a check is made to determine whether the frequency error measurement received at step 502 is the first frequency error measurement in a particular temperature band corresponding to the temperature measurement of step 504. If this is the first frequency error measurement within the particular temperature band, the process 500 proceeds to step 509. At step 509, an a-priori predicted oscillator offset within the particular temperature band is discarded in favor of a new value related to the frequency error measurement ("measured oscillator offset"). The process 500 proceeds from step 509 to step 511, where the measured oscillator offset is added to the temperature model 110.

At step 510, a check is made to determine if the temperature model should be updated. For example, the temperature model may be updated after a predetermined amount of frequency error measurements have been received. If the temperature model should be updated, the process 500 proceeds to step 512, where the temperature model is updated by performing a curve fitting process. The curve fitting process fits a curve to the measured oscillator offsets and any remaining predicted oscillator offsets. For example, a polynomial curve fit or a least squares curve fit may be used. Otherwise, the process 500 returns to step 504.

If the frequency error measurement received at step 502 is not the first frequency error measurement in the particular temperature band, the process 500 proceeds from step 508 to step 514. At step 514, a check is made to determine if a sufficient number measured oscillator offsets already exist for the particular temperature band. If not, the process 500 proceeds to step 511. If so, the process 500 proceeds to step 516, where the oldest measured oscillator offsets in the particular temperature band are discarded. The number of measured oscillator offsets that triggers the discarding of the oldest measured oscillator offsets is a design parameter that is at least partially based on the amount of memory usage and the complexity of the curve fit process. In this manner, the invention avoids accumulating an excessive number of measured oscillator offsets in any one temperature band, reducing the amount of memory consumed and the computation complexity of the curve fit process of step 512, which are each related to the number of offset data points in the temperature model 110. It is desirable, however, to have a sufficient number of measured oscillator offsets in each band since, individual frequency error measurements may be in error.

Figure 4B:
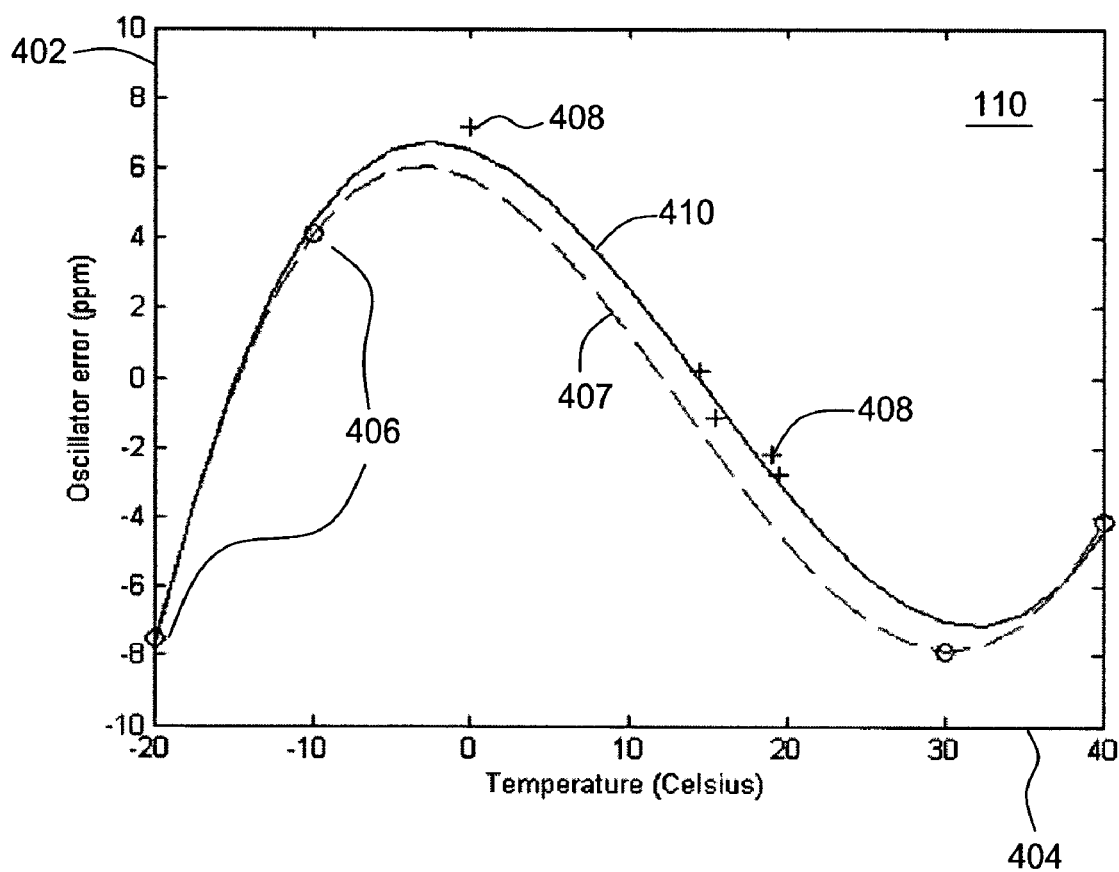

FIG. 4B is a graph showing an illustrative updated temperature model after a plurality of frequency error measurements have been made. As described above, the axis 402 represents oscillator error in units of ppm, and the axis 404 represents temperature in degrees Celsius. A plurality of measured oscillator offsets 408 (five are shown) have been added to the temperature model 110 based on the frequency error measurements as described above. A curve 410 depicts a model of an updated temperature model after the curve fitting process. The curve fit process fits a combination of the measured oscillator offsets 408, and the pre-programmed predicted oscillator offsets 406. As illustrated, the curve 410 closely matches the measured oscillator offsets 408 in temperature regions where the measured oscillator offsets 408 are available, and closely matches the pre-programmed curve 407 in temperature regions where the pre-programmed predicted oscillator offsets 406 remain. It is apparent that the temperature model 110 has deviated from the a-priori temperature model due to drift or other effects as discussed above.

Figure 4C:
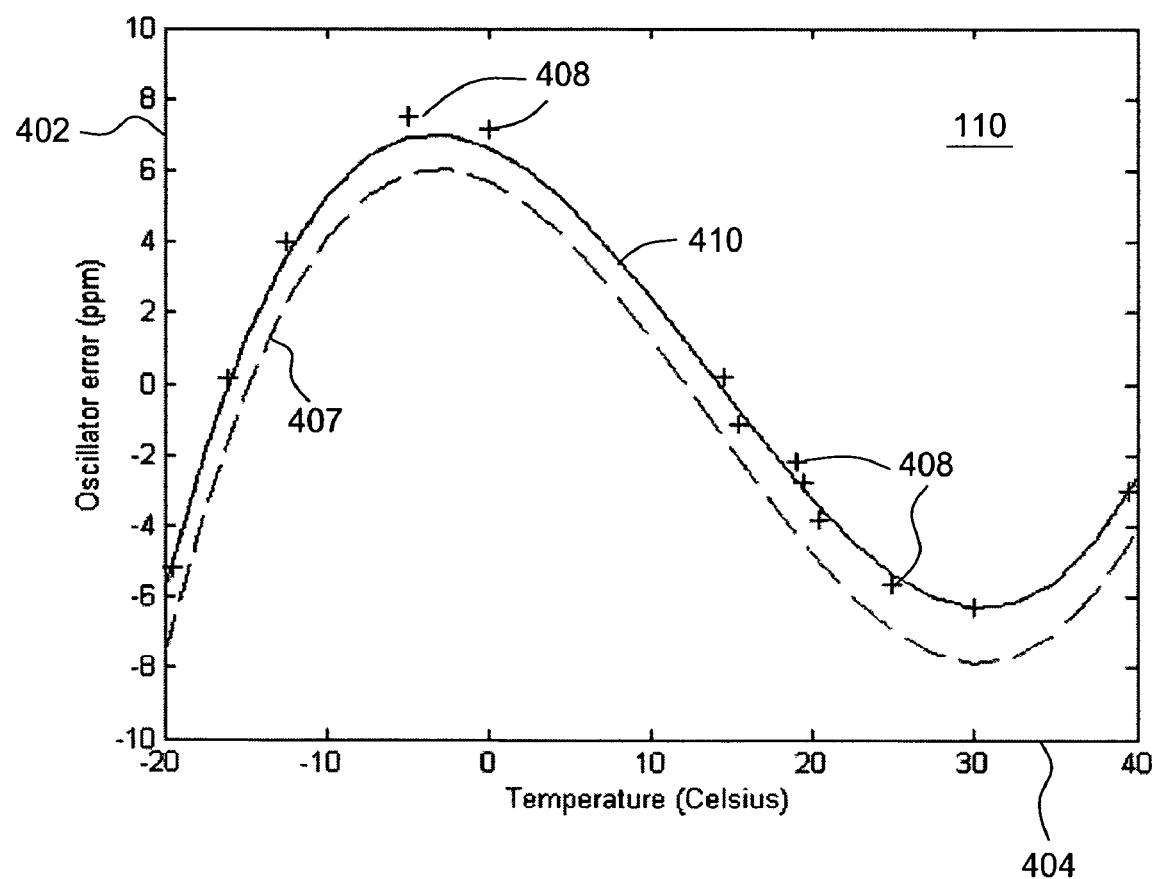

FIG. 4C is a graph showing an illustrative updated temperature model after a plurality of frequency error measurements have been made across the full temperature range of the temperature model 110. As is apparent, the updated curve 410 closely matches the measured oscillator offsets 408, which span the entire temperature range of the temperature model 110. All of the predicted oscillator offsets 406 have thus been discarded in favor of the measured oscillator offsets 408. In this example, the temperature model 110 has completely deviated from the a-priori temperature model.

It should be noted that the frequency error measurements, for example, pilot tone deviation measurements, may have some error associated therewith. In particular, the frequency error measurements are subject to measurement noise, base station frequency errors, and errors induced by the Doppler effect if the mobile device 102 is moving. For this reason, it is desirable to save a history of frequency error measurements. The curve fit process can employ an algorithm, such as a least squares fit, to best fit the history of available data. The use of multiple data points improves the process, making the system more robust to errors in the frequency error measurements.

Figure 6:
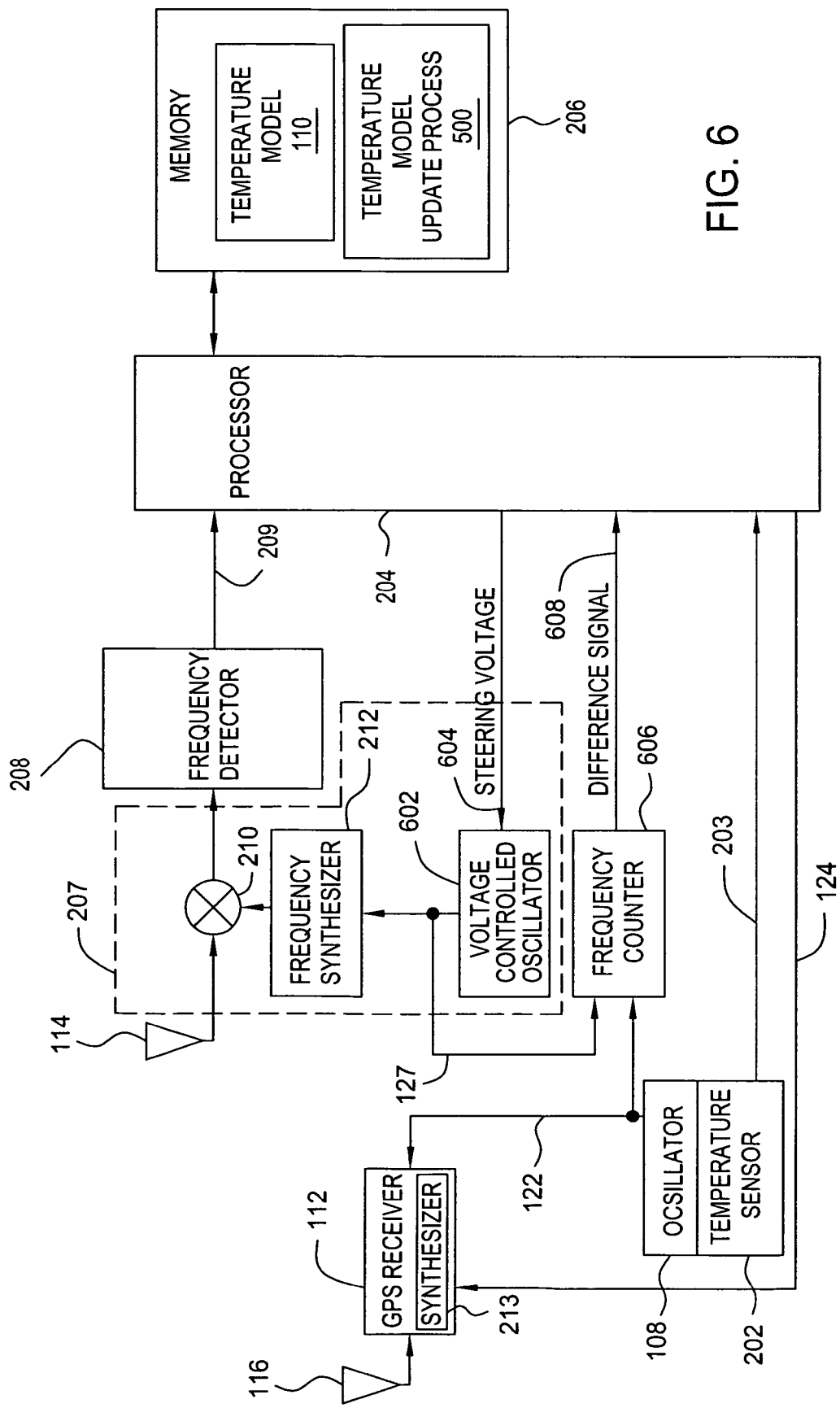
FIG. 6 depicts a block diagram showing another exemplary embodiment of a portion of the mobile device of FIG. 1 in accordance with one or more aspects of the invention.

FIG. 6 depicts a block diagram showing another exemplary embodiment of a portion of the mobile device 102 in accordance with one or more aspects of the invention. Elements of FIG. 6 that are the same or similar to elements depicted in FIGS. 1 and 2 are designated with identical reference numerals and are described in detail above. In this embodiment, the tuner 207 utilizes a separate voltage controlled oscillator (VCO) 602 for receiving wireless signals. The GPS receiver 112, as in the embodiment of FIG. 2, is driven by the oscillator 108, which operates in proximity to the temperature sensor 202. In this embodiment, the invention provides the flexibility of a steered oscillator (VCO 602) for the tuner 207, which is typical of certain wireless receivers, such as cellular telephone devices, while using a non-steered oscillator (oscillator 108) for the GPS receiver 112. In some instances, there are advantages to having separate oscillators, including frequency plan and power management considerations.

The VCO 602 is steered by a steering voltage signal 604 generated by the processor 204. Typically, the steering voltage signal 604 is generated by a digital to analog converter (not shown). The processor 204 uses the steering voltage signal 604 to keep the VCO 602 within a desired tuning range. The processor 204 generates the steering voltage signal 604 using the frequency error signal 209. The frequency error signal 209 is derived from a frequency reference within the wireless signal, such as a pilot signal. Steering of the VCO 602 in this manner is well understood by those skilled in the art of wireless receiver design. Output of the VCO 602 is supplied to the frequency synthesizer 212 for receiving wireless signals.

The VCO 602 supplies the frequency reference signal 127 described above with respect to FIG. 1. The frequency reference signal 127 from the VCO 602 is coupled to a frequency counter 606 along with output 122 from the oscillator 108. The frequency counter 606 generates a signal indicative of a measurement that relates one oscillator frequency to another ("difference signal" 608). Notably, the frequency counter 606 provides a measurement of the offset between the non-steered oscillator 108 and the VCO 602, which is being steered to an absolute value in response to steering voltage signal 604. Thus, the difference signal 608 is an estimate of the absolute error of the oscillator 108. As described in more detail below, the processor 204 may execute the temperature model update process 500 using the difference signal 608 to adjust the temperature model 110.

Figure 7:
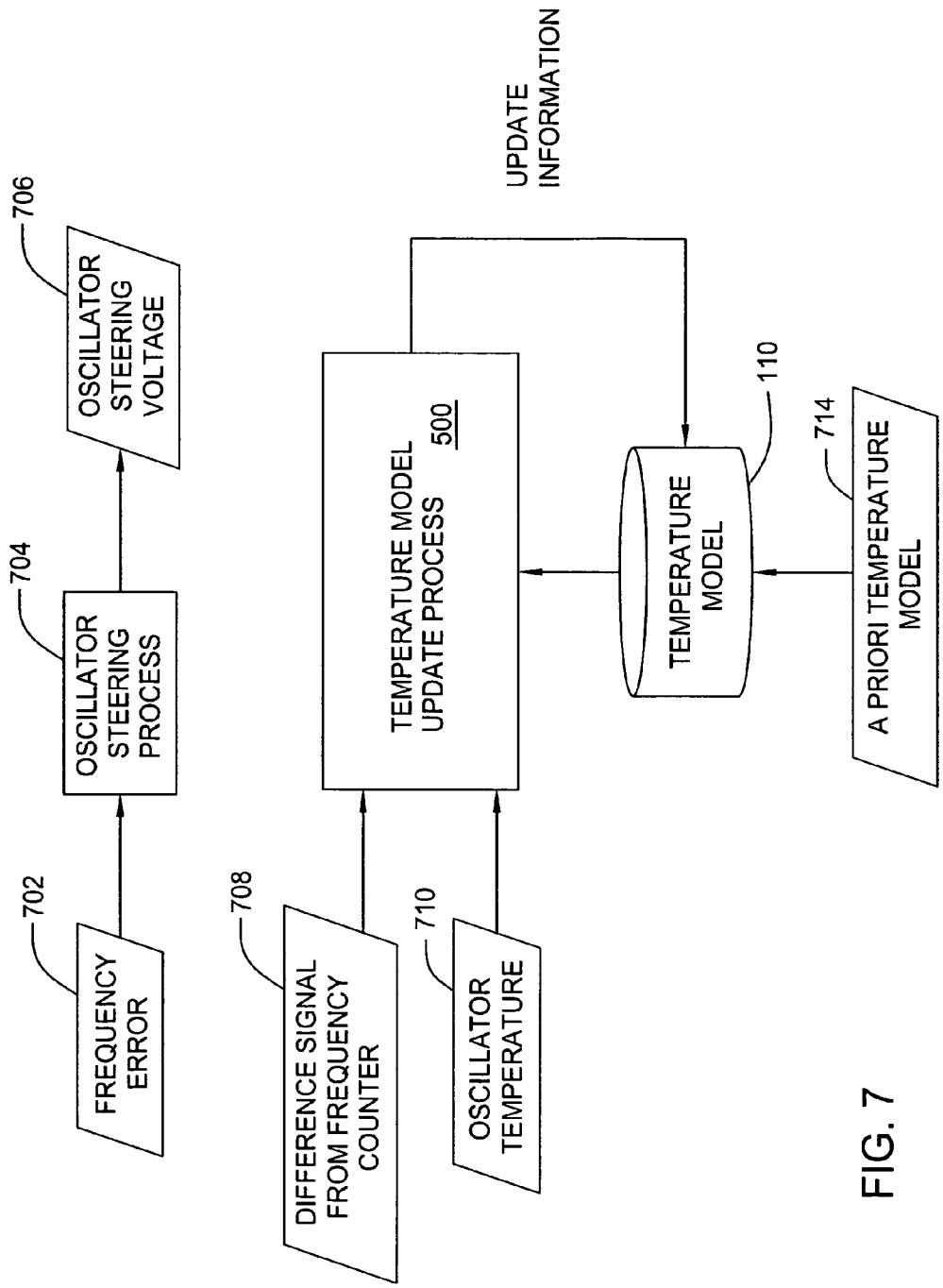
FIG. 7 depicts a data flow diagram showing the operation of the embodiment of the mobile device depicted in FIG. 6.

FIG. 7 depicts a data flow diagram showing the operation of the embodiment of the mobile device 102 depicted in FIG. 6. A frequency error 702 is supplied to an oscillator steering process 704. The frequency error 702 may be obtained from the frequency error signal 209. The oscillator steering process 704 produces an oscillator steering voltage 706 using the frequency error 702. Algorithms for oscillator steering process 704 are well known in the industry.

A difference measurement 708, an oscillator temperature 710, and a temperature model 110 are supplied to a temperature model update process 500. In this embodiment, the frequency error measurement received at step 504 of the process 500 corresponds to the difference measurement 708. The difference measurement 708 may be obtained from the difference signal 608 supplied the frequency counter 606. Initially, the temperature model 110 is based on an a-priori temperature model 714 substantially as described above. The difference measurement 708 provides information indicative of the actual frequency error of the oscillator 108 at a measured temperature. The actual error measurements may be used to improve the temperature model 110 as described above. Over time, as difference measurements are accumulated across operating temperatures, the temperature model 110 will be fully updated.

Figure 8:
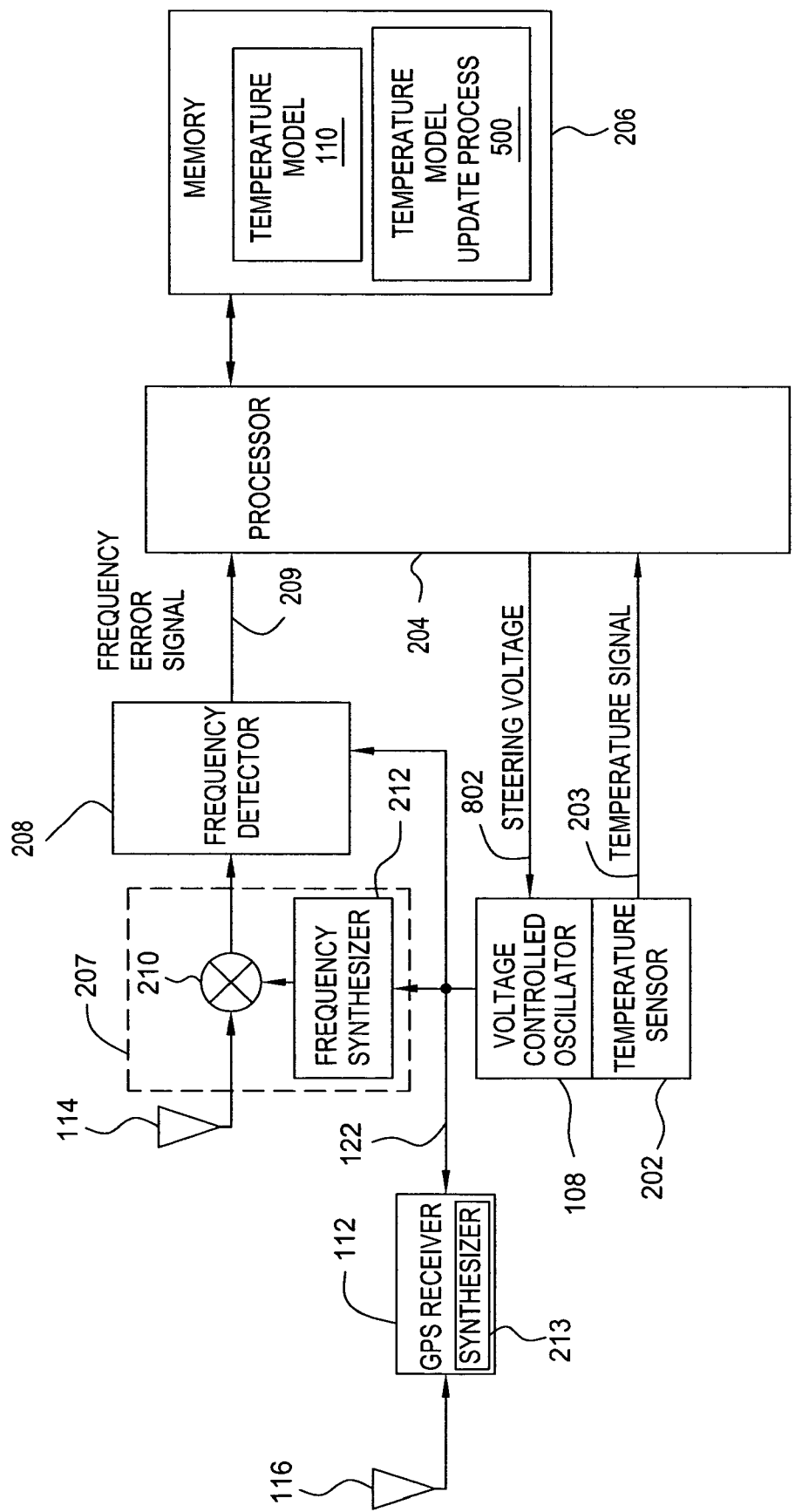
FIG. 8 depicts a block diagram showing another exemplary embodiment of a portion of the mobile device of FIG. 1 in accordance with one or more aspects of the invention.

FIG. 8 depicts a block diagram showing another exemplary embodiment of a portion of the mobile device 102 in accordance with one or more aspects of the invention. Elements of FIG. 8 that are the same or similar to elements depicted in FIGS. 1 and 2 are designated with identical reference numerals and are described in detail above. In this embodiment, the oscillator 108 is used as a reference for both the GPS receiver 112 and the tuner 207. In contrast to the mobile device of FIG. 2, however, the oscillator 108 is a steerable oscillator, such as a VCO. Notably, output of the oscillator 108 is coupled to the GPS receiver 112 and the wireless tuner 207. The GPS receiver 112 and the wireless tuner 207 employ the output of the oscillator 108 as a reference to receive GPS signals and wireless signals, respectively.

In particular, the temperature sensor 202 is located proximate the oscillator 108 and provides the temperature signal 203 to the processor 204. The processor 204 uses the temperature signal 203 to generate a steering voltage signal 802. The steering voltage signal 802 is generated using the temperature model 110. Notably, in the present embodiment, the temperature model 110 is a voltage-temperature characteristic that relates temperature measurements to steering voltage estimates. For any particular input temperature, the output of the voltage-temperature model 110 is a voltage required to steer the oscillator to its nominal frequency. The processor 204 uses the temperature signal 203 and the temperature model 110 to produce the steering voltage signal 802 in a known manner. The steering voltage signal 802 is coupled to the oscillator 108 through a digital to analog converter (not shown). The processor 204 uses the steering voltage signal 802 to keep the oscillator 108 within a desired tuning range.

The frequency error signal 209 may be used to update the temperature model 110 using temperature model update process 500. Since the wireless tuner 207 employs the oscillator 108 as a frequency reference, the frequency error signal 209 is made in reference to the oscillator 108. Thus, the invention of the present embodiment obviates the need for a frequency counter. In addition, since the steering voltage signal 802 is produced using the temperature model 110, rather than using a frequency reference in a wireless signal, such as a pilot tone, the oscillator 108 is steered even in the absence of frequency error measurements. This allows the GPS receiver 112 to be used regardless of the availability of a frequency reference within the wireless signal, such as a cellular pilot tone.

Figure 9:
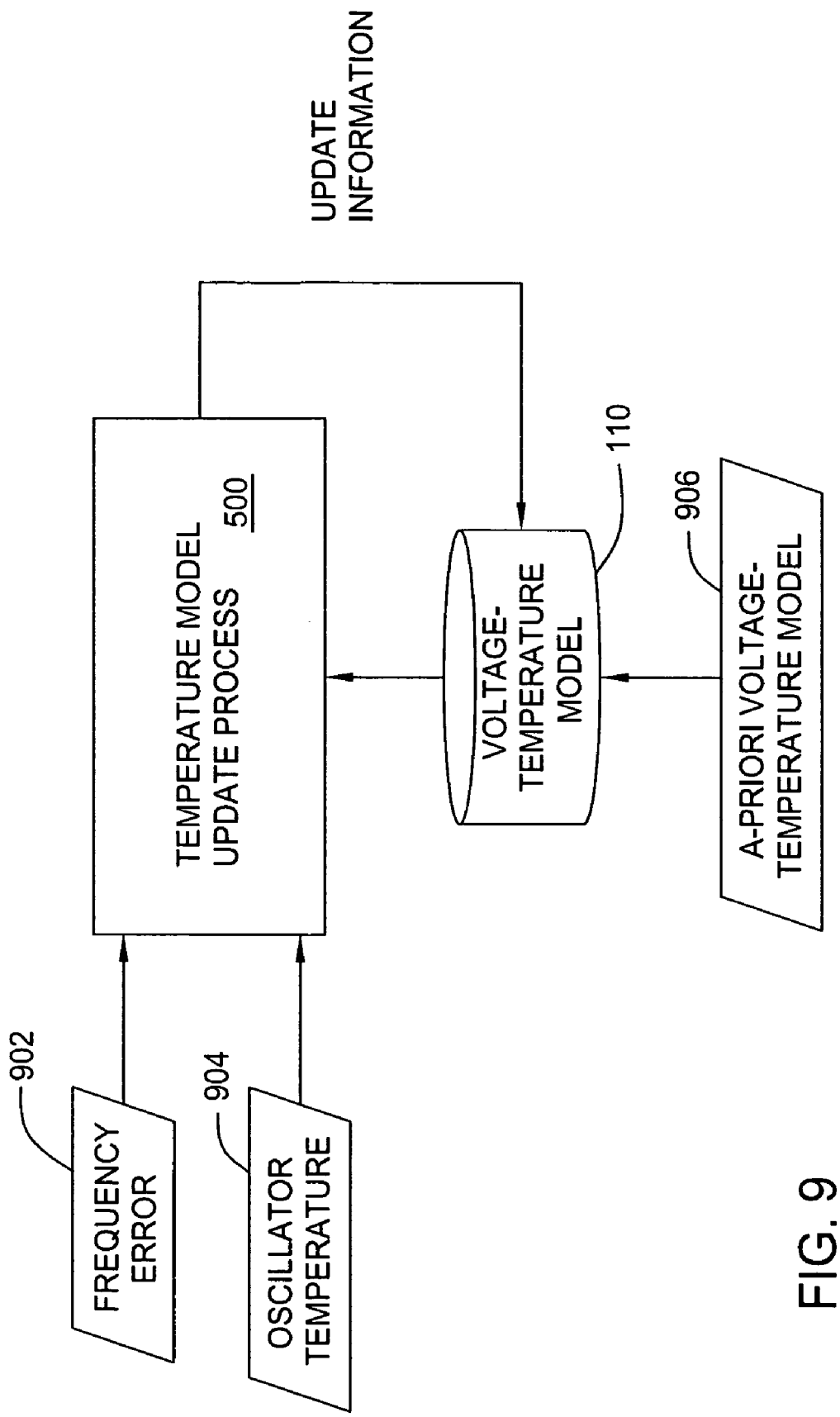
FIG. 9 depicts a data flow diagram showing the operation of the embodiment of the mobile device depicted in FIG. 8.

FIG. 9 depicts a data flow diagram showing the operation of the embodiment of the mobile device 102 depicted in FIG. 8. A frequency error 902, an oscillator temperature 904, and the temperature model 110 are input to a temperature model update process 500. Notably, the temperature model 110 is a voltage-temperature model as described above. Initially, the voltage-temperature model 110 is based on an a-priori voltage-temperature model 906 associated with the oscillator 108. The frequency error 902 may be used to provide an estimate of the actual tuning error in the oscillator 108 from its nominal frequency, and can be used to improve the temperature model 110 as described above. Over time, as difference measurements are accumulated across operating temperatures, the temperature model 110 will be fully updated.

Figure 10A:
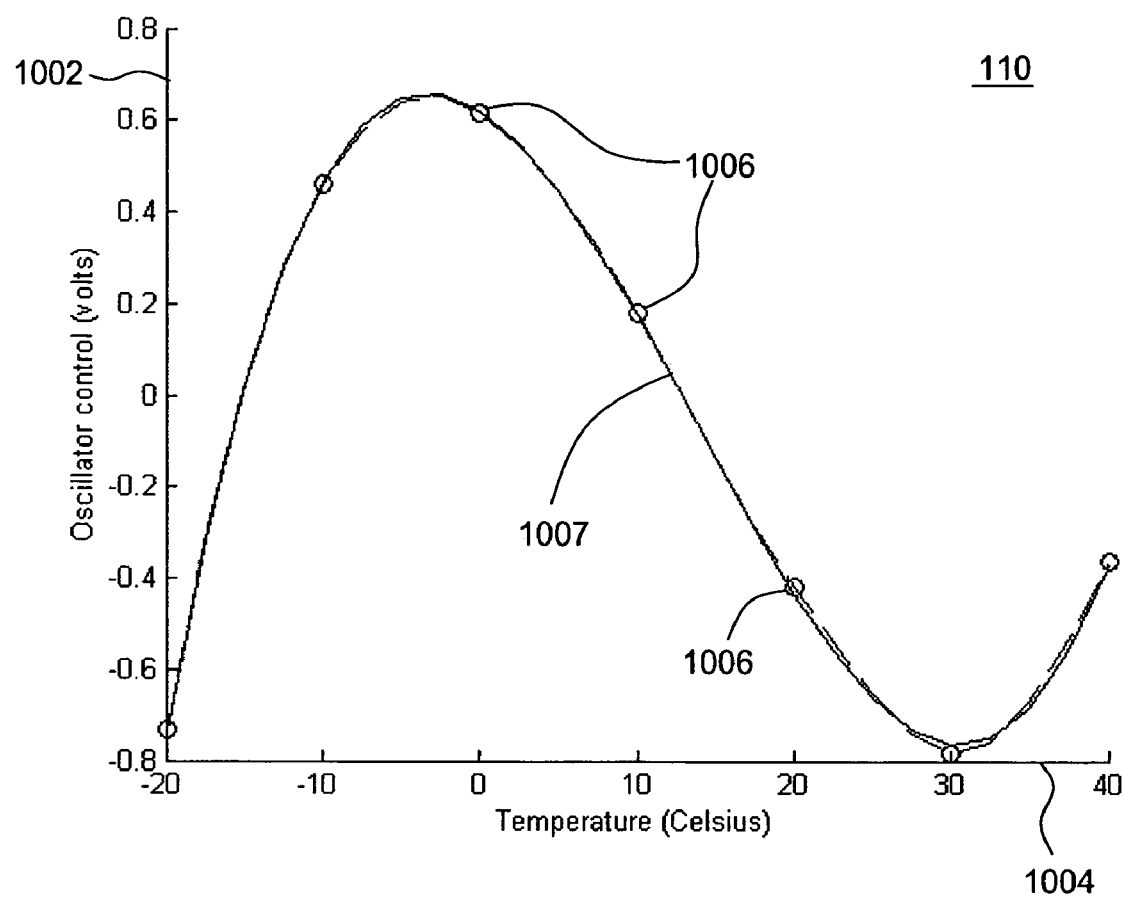
FIGS. 10A–B show graphs of illustrative a-priori and updated oscillator voltage-temperature models in accordance with one or more aspects of the invention.

FIG. 10A depicts a graph showing an illustrative voltage-temperature model 110 as initially based on an a-priori voltage-temperature model 906 in accordance with one or more aspects of the invention. An axis 1002 represents oscillator control in units of volts, and an axis 1004 represents temperature in degrees Celsius. The voltage-temperature model 110 includes a plurality of predicted oscillator control voltages 1006 (seven are shown). Since the voltage-temperature model 110 is based on the a-priori voltage-temperature model 906, the predicted oscillator control voltages 1006 indicate pre-programmed predictions of the oscillator control voltage in volts that is required to drive the oscillator 108 to its nominal frequency for a particular temperature in degrees Celsius. While only seven of the predicted oscillator offsets 1006 are shown for purposes of exposition, in practice, the voltage-temperature model 110 may include a multiplicity of predicted offsets 1006. As is apparent from FIG. 10A, the voltage-temperature model 110 of the oscillator 108 may be modeled as a continuous curve 1007. The voltage-temperature model 110 may be modeled using a polynomial fit to the predicted oscillator offsets 1006.

Figure 10B:
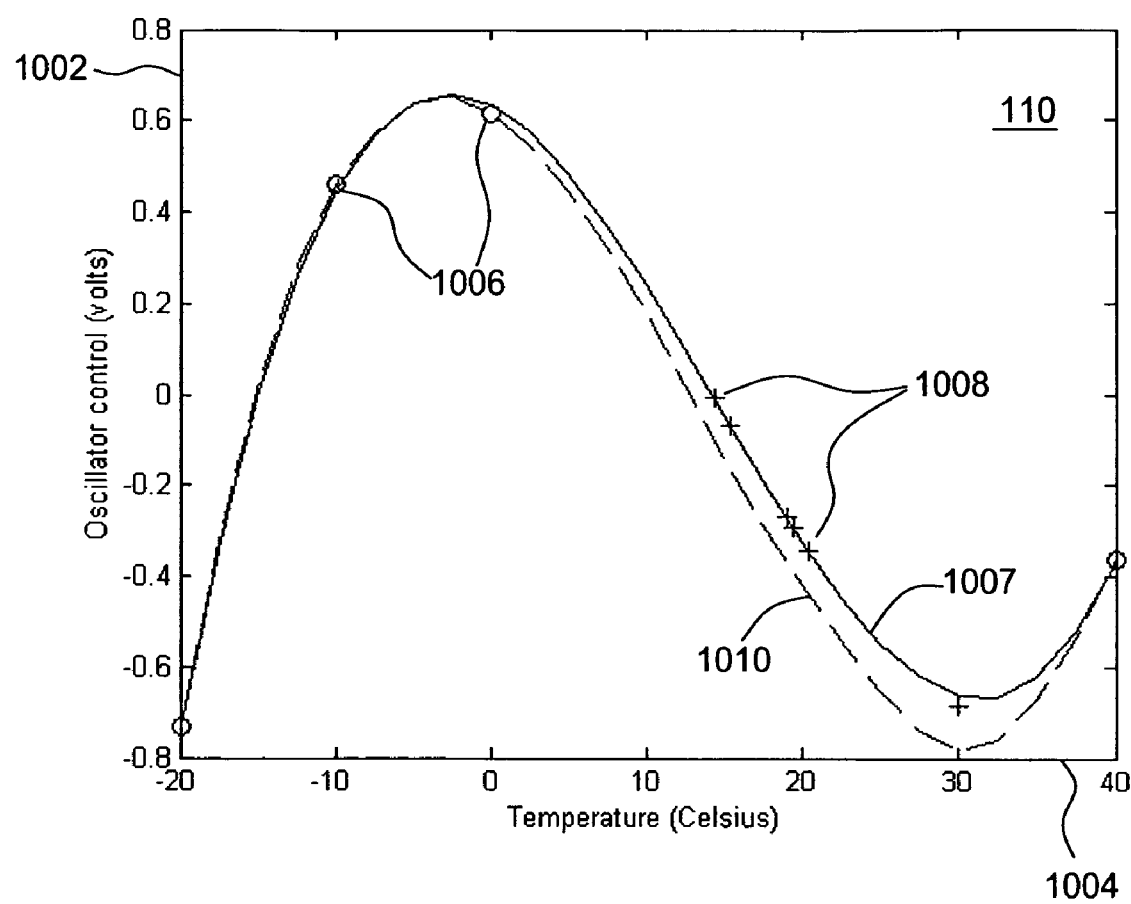

FIG. 10B is a graph showing an illustrative updated voltage-temperature model after a plurality of frequency error measurements have been made. As described above, the axis 1002 represents oscillator control in units of volts, and the axis 1004 represents temperature in degrees Celsius. A plurality of measured oscillator control voltages 1008 (six are shown) have been added to the voltage-temperature model 110 based on the frequency error measurements. The measured oscillator control voltages 1008 are not frequency error measurements themselves, but are rather improved estimates of the steering voltage required at a given temperature. A curve 1010 depicts a model of an updated voltage-temperature model after the curve fitting process. The curve fit process fits a combination of the measured oscillator control voltages 1008, and the pre-programmed predicted oscillator control voltages 1006. As illustrated, the curve 1010 closely matches the measured oscillator control voltages 1008 in temperature regions where the measured oscillator control voltages 1008 are available, and closely matches the pre-programmed curve 1007 in temperature regions where the pre-programmed predicted oscillator control voltages 1006 remain. It is apparent that the voltage-temperature model 110 has deviated from the a-priori voltage-temperature model due to drift or other effects as discussed above.

The oscillator control voltages 1008 may be derived from the frequency error measurements using the slope of the voltage-temperature model 110. Specifically, the frequency error measurement indicates the current frequency error of the oscillator 108 from nominal. This value is divided by the slope of the voltage-temperature model 110 to determine the error in the steering voltage. Mathematically this operation can be expressed as follows:

$$V_{estimate}(T) = V_{current} + f_{error}(T)/\text{alpha}(T)$$

where $V_{estimate}(T)$ is the estimated steering voltage at temperature T; $f_{error}(T)$ is the measured frequency error; $V_{current}$ is the steering voltage currently applied to the oscillator 108; and alpha(T) is slope of the voltage-temperature model 110 at temperature T. This operation requires that alpha(T) be available to relate the frequency error measurement to a voltage tuning error. Typically this can be provided as an a-prior table lookup or curve fit.

While the foregoing is directed to illustrative embodiments of the present invention, other and further embodiments of the invention may be devised without departing from the basic scope thereof, and the scope thereof is determined by the claims that follow.

What is claimed is:

1. In a mobile device having a wireless receiver for receiving wireless signals and a global positioning system (GPS) receiver for receiving satellite signals, wherein the mobile device includes an oscillator for providing first and second oscillator signals for use with the wireless receiver, a method of providing to the GPS receiver reference information for processing the satellite signals, the method comprising:

obtaining the first oscillator signal;

sensing a first temperature proximate to the oscillator;

obtaining, from a temperature model of the oscillator, an oscillator-signal error, wherein the oscillator-signal error is a function of a comparison between frequencies of a wireless signal and the second oscillator signal, and wherein the comparison comprises:

obtaining the wireless and second oscillator signals;

sensing a second temperature proximate to the oscillator;

comparing the frequencies of the wireless and second oscillator signals so as to produce a frequency error; and adjusting the temperature model as a function of the frequency error and the temperature; and providing to the GPS receiver the oscillator-signal error and the first oscillator signal, wherein the GPS receiver is operable to process satellite signals using the oscillator-signal error and the first oscillator signal.

2. The method of claim 1, wherein comparing the frequencies of the wireless and second oscillator signals so as to produce the frequency error comprises: (i) measuring a reference frequency associated with the wireless signal; and (ii) determining an offset, wherein the offset is a difference between frequencies of the reference frequency and a nominal frequency of the second oscillator signal, and wherein adjusting the temperature model as a function of the second frequency error and the second temperature comprises: using the second frequency error to update a portion of the temperature model that is associated with the first temperature.

3. In a mobile device having a wireless receiver for receiving wireless signals and a global positioning system (GPS) receiver for receiving satellite signals, wherein the mobile device includes an oscillator for providing first and second oscillator signals for use with the wireless receiver, a method of providing to the GPS receiver reference information for processing the satellite signals, the method comprising:

obtaining the first oscillator signal;

sensing a first temperature proximate to the oscillator;

obtaining, from a temperature model of the oscillator, an oscillator-signal error, wherein the oscillator-signal error is a function of a comparison between frequencies of a first wireless signal and the second oscillator signal; and providing to the GPS receiver the oscillator-signal error and the first oscillator signal, wherein the GPS receiver is operable to process satellite signals using the oscillator-signal error and the first oscillator signal;

obtaining a second wireless signal and a third oscillator signal;

sensing a second temperature proximate to the oscillator;

comparing frequencies of the second wireless signal and the third oscillator signal so as to produce a second frequency error; and adjusting the temperature model as a function of the second frequency error and the second temperature so as to produce an adjusted temperature model.

4. The method of claim 3, further comprising using the adjusted temperature model to compensate for error in a fourth oscillator signal so as to produce a compensated oscillator signal.

5. The method of claim 4, wherein compensating using the adjusted temperature model to compensate for error in a fourth oscillator signal comprises adjusting, as function of the second frequency error, an output frequency of the oscillator.

6. The method of claim 4, further comprising providing to the GPS receiver the compensated oscillator signal, wherein the GPS receiver is operable to process satellite signals using the compensated oscillator signal.

7. The method of claim 3, further comprising:
obtaining a fourth oscillator signal;
obtaining from the adjusted temperature model a second oscillator-signal error; and
providing to the GPS receiver the second oscillator-signal error and the fourth oscillator signal, wherein the GPS receiver is operable to process satellite signals using the second oscillator-signal error and the fourth oscillator signal.

8. A location-enabled wireless device, comprising:
a wireless receiver operable to receive a first wireless signal;
a global positioning system (GPS) receiver operable to receive a GPS signal;
an oscillator operable to supply to the wireless and GPS receivers a first oscillator signal;
a temperature model for compensating the first oscillator signal as a function of temperature;
a frequency detector operable to supply, as a function of the first wireless signal and the first oscillator signal, a frequency error; and
a processor operable to (i) obtain a temperature proximate to the oscillator; (ii) obtain from the frequency detector the frequency error; (iii) use the temperature model to produce, as a function of the temperature and the frequency error, an oscillator-signal error; and (iv) provide to the GPS receiver the oscillator-signal error, wherein the GPS receiver is operable to use the oscillator-signal error and the first oscillator signal to process satellite signals, wherein the oscillator-signal error comprises an error associated with the temperature and a comparison between frequencies of a second wireless signal and a second oscillator signal, and wherein the second wireless signal and the second oscillator signal are obtained prior to the first wireless signal and the first oscillator signal.

9. The device of claim 8, further comprising memory operable to store the temperature model, wherein the memory is coupled and operable to exchange with the processor information associated the temperature model.

10. The device of claim 8, wherein the processor is further operable to adjust the temperature model as a function of the temperature and the frequency error.

11. The device of claim 8, wherein the oscillator is a voltage-controlled oscillator, wherein the processor is further operable to generate, as a function of the temperature, a steering voltage for steering the voltage-controlled oscillator, and wherein the oscillator-signal error comprises the steering voltage.

12. A location-enabled wireless device, comprising:
a wireless receiver operable to receive a first wireless signal;
a global positioning system (GPS) receiver operable to receive a GPS signal;
a first oscillator operable to supply to the GPS receiver first and third oscillator signals, wherein the first oscillator is operable to provide the third oscillator signal prior to providing the first oscillator signal;
a second oscillator operable to supply to the wireless receiver second and fourth oscillator signals, wherein the second oscillator is operable to provide the fourth oscillator signal prior to providing the second oscillator signal;
a temperature model for compensating the first oscillator signal as a function of temperature;
a frequency counter operable to supply a first reference signal, wherein the first reference signal is a function of a comparison between the first and second oscillator signals; and
a processor operable to (i) obtain a temperature proximate to the first oscillator; (ii) obtain from the frequency counter the reference signal; (iii) use the temperature model to produce, as a function of the temperature and the reference signal, an oscillator-signal error; and (iv) provide to the GPS receiver the oscillator-signal error, wherein the GPS receiver is operable to use the oscillator-signal error and the first oscillator signal to process satellite signals, wherein the oscillator-signal error comprises an error associated with the temperature and a second reference signal, and wherein the second reference signal is a function of a comparison between frequencies of third and fourth oscillator signals.

13. The device of claim 12, wherein the processor is further operable to adjust the temperature model as a function of the temperature and the first reference signal.

14. The device of claim 13, wherein
the first and second oscillators are further operable to provide third and fourth oscillator signals, respectively,
the frequency counter is further operable to supply, as a function of the third and fourth oscillator signals, a second reference signal,
the temperature model is divisible into at least first and second temperature bands,
each of the first and second temperature bands comprise a respective plurality of portions,
each of the plurality of portions include a new portion and an old portion, and
the processor is further operable to: (i) use the first reference signal to (a) update the new portion of the first temperature band, and (b) discard the old portion of the first temperature band in favor of the new portion of the first temperature band if a predetermined number of the plurality of portions of the first temperature band have been updated; and (ii) use the second reference signal to (a) update the new portion of the second temperature band, and (b) discard the old portion of the second temperature band in favor of the new portion of the second temperature band if a predetermined number of the plurality of portions of the second temperature band have been updated.

15. The device of claim 12, further comprising memory operable to store the temperature model, wherein the memory is coupled to and operable to exchange with the processor information associated the temperature model.

16. The device of claim 12, wherein the first and second oscillators are further operable to provide third and fourth oscillator signals, respectively, wherein the frequency counter is further operable to supply, as a function of the third and fourth oscillator signals, a second reference signal; and wherein the processor is further operable to (i) obtain a second temperature proximate to the first oscillator; (ii) obtain from the frequency counter the second reference signal; and (iii) adjust the temperature model as a function of the second temperature and the second reference signal.

17. The device of claim 16, wherein the processor is further operable to (i) use the temperature model to produce, as a function of the second temperature and the second reference signal, a second oscillator-error signal, and (ii) provide to the GPS receiver the second oscillator-signal error, and wherein the GPS receiver is operable to use the second oscillator-signal error and the second oscillator signal to process satellite signals.

* * * * *

UNITED STATES PATENT AND TRADEMARK OFFICE
CERTIFICATE OF CORRECTION

PATENT NO.       : 7,239,857 B2                                Page 1 of 1
APPLICATION NO.  : 11/311088
DATED            : July 3, 2007
INVENTOR(S)      : Abraham It is certified that error appears in the above-identified patent and that said Letters Patent is hereby corrected as shown below:

On the face page, in field (73), in "Assignee", in column 1, line 1, before "San Jose," insert -- 3910 S. Bascom, Suite 260 --.

On the face page, in field (73), in "Assignee", in column 1, line 1, after "CA (US)" insert -- 95124 --.

On Sheet 1 of 13, in FIG. 1 (Reference Numeral 102), line 1, delete "MOBIL" and insert -- MOBILE --, therefor.

On Sheet 9 of 13, in FIG. 7 (Reference Numeral 714), line 1, delete "A PRIORI" and insert -- A-PRIORI --, therefor.

In column 3, line 20, after "invention" delete "." and insert -- ; --, therefor.

In column 5, line 46, after "16, 2003" delete "," and insert -- (Attorney Docket number GLBL 033), --, therefor.

Signed and Sealed this

Thirtieth Day of October, 2007

JON W. DUDAS
*Director of the United States Patent and Trademark Office*